United States Patent [19]

Imai et al.

[11] 4,367,408

[45] Jan. 4, 1983

[54] PYROELECTRIC TYPE INFRARED RADIATION DETECTING DEVICE

[75] Inventors: Terutoyo Imai, Hirakata; Shoichi Nakano, Yawata, both of Japan

[73] Assignee: Sanyo Electric Co., Ltd., Moriguchi, Japan

[21] Appl. No.: 109,351

[22] Filed: Jan. 3, 1980

[30] Foreign Application Priority Data

Jan. 17, 1979 [JP] Japan ............................. 54/4048[U]
Dec. 12, 1979 [JP] Japan ............................. 54/169674

[51] Int. Cl.$^3$ ............................................. G01J 1/00
[52] U.S. Cl. ..................................... 250/338; 250/339; 250/340; 310/306
[58] Field of Search ................. 29/573; 136/211, 213, 136/240; 310/306; 250/338, 339, 340

[56] References Cited

U.S. PATENT DOCUMENTS

| | | | |
|---|---|---|---|
| 3,103,587 | 9/1963 | Ure | 136/213 |
| 3,511,991 | 5/1970 | Beerman | 136/213 |
| 3,571,592 | 3/1971 | Glass | 136/213 |
| 3,733,499 | 5/1973 | Deis | 136/213 |
| 3,773,564 | 11/1973 | Yamaka | 136/238 |
| 4,218,620 | 8/1980 | Oettel | 250/338 |
| 4,250,384 | 2/1981 | Pulvari | 136/213 |
| 4,258,260 | 3/1981 | Obara | 250/338 |

*Primary Examiner*—Paul R. Michl
*Attorney, Agent, or Firm*—Darby & Darby

[57] ABSTRACT

A pyroelectric pellet made of a Z cut plane of lithium tantalate, for example, is fixed onto an electrically conductive supporting base made of copper, for example, by means of an adhesive agent layer. One embodiment of the adhesive agent layer interposed between the pyroelectric pellet and the electrically conductive supporting base comprises a mixture of an electrically conductive adhesive agent, such as a silver paste, admixed with heat insulating grains made of glass, ceramic, or the like, whereby thermal dissipation from the pyroelectric pellet to the electrically conductive supporting base is decreased. Another embodiment of the adhesive agent layer comprises an electrically conductive adhesive agent layer in which is embedded a thin sheet made of synthetic resin having apertures. The electrically conductive adhesive agent extends through the apertures of the sheet so as to fix the pyroelectric pellet to the electrically conductive supporting base.

60 Claims, 17 Drawing Figures

PYROELECTRIC TYPE INFRARED RADIATION DETECTING DEVICE

BACKGROUND OF THE INVENTION

1. Field of the Invention

The present invention relates to a pyroelectric type infrared radiation detecting device. More specifically, the present invention relates to an improved pyroelectric type infrared radiation detecting device including a pyroelectric pellet generating an electric charge as a function of a variation of an incidental infrared radiation and a base for supporting the pellet.

2. Description of the Prior Art

An infrared radiation detecting device employing a pellet having a pyroelectric effect has been proposed and put into practical use as a temperature sensor, an intruder alarm, and the like. As is well known, such a pyroelectric pellet is responsive to a variation in an incidental infrared radiation so as to generate on the surface thereof an electric charge, wherein the smaller the thermal emission coefficient of the pyroelectric pellet, the greater the quantity of generated electric charge. Heretofore, therefore, various structures have been proposed and implemented to suppress thermal dissipation from such a pyroelectric pellet.

FIG. 1 is a view showing one example of a structure of a conventional pyroelectric type infrared radiation detecting device which constitutes the background of the present invention. The conventional one shown in FIG. 1 comprises a pyroelectric pellet 1 having electrodes 2 and 3 on both main surfaces. The electrode 2 of the pyroelectric pellet 1 is connected to a mount base 4 by means of lead wires 6 made of gold, for example. In such a case the lead wires 6 also serve to support the pellet 1 at a position spaced apart from the mount base 4, as shown in FIG. 1. Connection of the electrode 2 of the pyroelectric pellet 1 and the lead wires 6 is made by means of an electrically conductive adhesive agent 7, such as a silver paste and the like. A lead wire 9 is also similarly connected to the electrode 3 of the pyroelectric pellet 1 by means of an electrically conductive adhesive agent 8. The lead wire 9 is connected to one of two terminals 10. The terminals 10 serve to withdraw an electric charge generated on the surface of the pyroelectric pellet 1. Although not shown in FIG. 1, it has been a most common practice that a chip integrally including a field effect transistor and operational amplifier and resistors therefor, is placed on the mount base 4, while the electrode 3 and the lead wire 9 are connected to the chip, so that the output from the chip is withdrawn through the terminals 10.

According to the FIG. 1 structure, it follows that an air layer exists between the pyroelectric pellet 1 and the mount base 4. Thermal conductivity of the air is extremely poor, so that the same serves as a heat insulation. Therefore, heat dissipated from the pyroelectric pellet 1 is small and accordingly the output from the pellet 1 and thus from the terminals 10 becomes large. However, such a structure as shown in FIG. 1 involves the problems to be discussed in the following. More specifically, since the thinner the thickness of the pyroelectric pellet, the higher the sensitivity thereof, it is preferred that the pellet be thinner than say 100 µm. Nevertheless, since, with such a structure as shown in FIG. 1, it is necessary to individually handle such a thin pyroelectric pellet 1, precise work is required. Accordingly, productivity is very poor. Furthermore, since the pyroelectric pellet 1 is connected and supported only by the lead wires 6, the mechanical strength is weak and accordingly the reliability thereof is also poor.

Therefore, a pyroelectric type infrared radiation detecting device of such a structure as shown in FIG. 2 has also been proposed. The infrared radiation detecting device as shown in FIG. 2 comprises a pyroelectric pellet 1 fixed to a mount base 4 by means of a base 11 which is made of a material of extremely poor thermal conductivity such as quartz. The electrode 2 of the pyroelectric pellet 1 is fixed to the upper surface of the supporting base 11 by means of an electrically conductive adhesive agent 12 such as a silver paste. One end of the lead wire 6 is connected to a portion of the electrically conductive adhesive agent 12, while the other end of the lead wire 6 is connected to the terminal 10.

Since such a conventional device as shown in FIG. 2 can make thermal dissipation from the pyroelectric pellet 1 substantially equal to that of the FIG. 1 device, the mechanical strength can be increased and reliability can be enhanced, without adversely affecting the output of the pyroelectric pellet 1. In addition, since the pyroelectric pellet 1 can be lapped while fixed on the supporting base 11, the working efficiency can be enhanced and hence mass production is improved. However, with such a structure as shown in FIG. 2, further problems are involved. More specifically, the pyroelectric pellet 1 is extremely thin, as described above, and the electrodes 2 and 3 and the conductive adhesive agent layer 12 are also very thin, as thin as several tens µm. Accordingly, it is extremely difficult to connect the lead wire 6 to the exposed side surface of the conductive adhesive agent layer 12 without causing short circuiting of the electrodes 2 and 3. Such difficulty in the connection of the lead wire 6 also causes degradation of the productivity thereof.

Therefore, one might think of substituting a conductive supporting base 13 made of a metallic or electrically conductive material for the supporting base 11 as shown in FIG. 2. Employment of such a conductive supporting base 12 makes it possible to withdraw an electric charge generated in the pyroelectric pellet 1 through the electrode 2, the electrically conductive ahesive layer 12 and the electrically conductive supporting base 13. However, simple employment of the conductive supporting base 13 involves the problems to be discussed in the following. More specifically, generally an electrically conductive material has good thermal conductivity and, accordingly, it follows that the pyroelectric pellet 1 is fixed to the electrically conductive supporting base 13 of a good thermal conductor through the electrode 2 and the electrically conductive adhesive agent layer 12, both of which have good thermal conductivity. Therefore, thermal dissipation from the pyroelectric pellet 1 becomes larger than that of the devices shown in FIGS. 1 and 2 and accordingly the output from the pyroelectric pellet 1 decreases. Thus, although such a device as shown in FIG. 3 can enhance productivity thereof, such structure adversely affects the device characteristics, such as a detection sensitivity.

SUMMARY OF THE INVENTION

For the purpose of eliminating the above described problems, the present invention resides in the formation of an adhesive agent layer between a conductive supporting base and a pyroelectric pellet, characterized in that the adhesive agent layer comprises a mixture of heat insulating portions for preventing thermal conduction from the pyroelectric pellet to the conductive base and electrically conductive adhesive agent portions.

According to the present invention, since a conductive material can be utilized as a pyroelectric pellet supporting base, a structure for withdrawing an electric charge generated in the pyroelectric pellet is simplified and a working efficiency is improved, and therefore productivity is enhanced. Furthermore, since the adhesive agent layer contains the heat insulating portions in a mixed manner, thermal dissipation from the pyroelectric pellet becomes extremely small as compared with that simply employing an electrically conductive base, with the result that an adverse influence upon detection sensitivity exerted by thermal dissipation from the pyroelectric pellet can be effectively eliminated.

In one preferred embodiment of the present invention, the adhesive agent layer comprises a mixture of an electrically conductive adhesive agent with heat insulating pieces or grains. The heat insulating grains may be of glass, ceramic and the like. In a preferred embodiment of the present invention, an adhesive agent layer can be formed by simply mixing heat insulating pieces or grains in an electrically conductive adhesive agent and as a result the productivity can be considerably enhanced.

In another preferred embodiment of the present invention, the adhesive agent layer comprises a thin sheet having a low thermal conductivity formed with notch portions, such that the electrically conductive adhesive agent is disposed to electrically connect the pyroelectric pellet and the electrically conductive base through the notch portions of the thin sheet. Even in the present embodiment, the adhesive agent layer can be formed by the simple operation of interposing a thin sheet formed of small notch portions, hence the productivity is considerably enhanced.

Therefore, a principal object of the present invention is to provide a pyroelectric type infrared radiation detecting device of an improved structure.

Another object of the present invention is to provide a pyroelectric type infrared radiation detecting device having excellent productivity and an excellent detection characteristic.

A further object of the present invention is to provide a pyroelectric type infrared radiation detecting device that is inexpensive.

Still a further object of the present invention is to provide a method for manufacturing a pyroelectric type infrared radiation detecting device having an excellent detection characteristic and excellent productivity.

These objects and other objects, features, aspects and advantages of the present invention will become more apparent from the following detailed description when taken in conjunction with the accompanying drawings.

DESCRIPTION OF THE PREFERRED EMBODIMENTS

Figure 3:
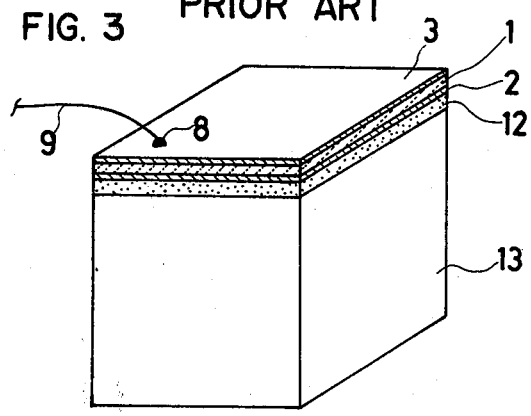
FIG. 3 is a view showing an element or chip of a pyroelectric infrared radiation detecting device constituting the background of the present invention.
Figure 4:
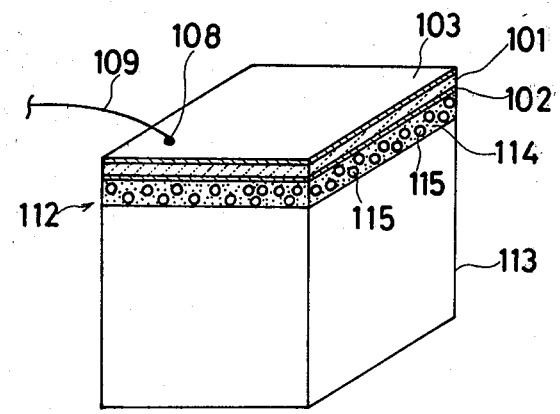
FIG. 4 is a view showing an element or chip of a pyroelectric type infrared radiation detecting device of one embodiment of the present invention.

FIG. 4 is a perspective view showing one example of an element or chip in accordance with one embodiment of the present invention. Referring to FIG. 4, the same portions as shown in FIG. 3 are denoted by the corresponding reference characters and a more detailed description thereof will be omitted. The essential feature of the embodiment resides in an adhesive agent layer 112. The adhesive agent layer 112 contains heat insulating pieces or grains mixed at a given ratio in an electrically conductive adhesive agent 114. The electrically conductive adhesive agent 114 may comprise a silver paste or a gold paste comprising a mixture of silver or gold powder and epoxy resin serving as a binder. The heat insulating grains 115 may be glass balls or ceramic pieces or grains having a diameter of approximately 10 to 80 μm. Too small a diameter of the heat insulating grains 115 does not bring about a heat insulating effect. Similarly, too small a ratio of the heat insulating grains 115 mixed in the electrically conductive adhesive agent 114 does not bring about a sufficient heat insulating effect. However, although too large a ratio of the heat insulating grains achieves a sufficient heat insulating effect, an adhesive strength by means of the adhesive agent layer 112 becomes weak, so with too much a favorable result is not obtained. Therefore, in the embodiment shown, the weight ratio of the heat insulating grains 115 with respect to the electrically conductive adhesive agent 114 is selected to be ½ to 1/100, preferably 1/5 to 3/100 and most preferably to be 1/10 to 1/20. As a result, a sufficient adhesive strength is achieved by the adhesive agent layer 112.

As such heat insulating grains 115, hollow glass balls or solid glass balls having the above described diameter, or ceramic pieces or grains of such as zirconiua, alumiuna, magnesia, or the like may be used. The mixing quantity thereof may be selected to be an optimum one within the above described range.

Figure 1:
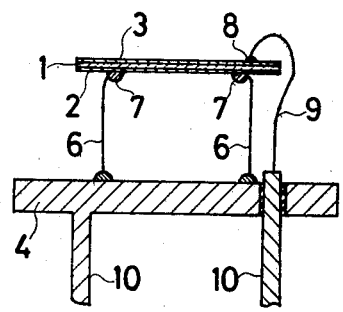
FIGS. 1 and 2 are views showing examples of conventional pyroelectric type infrared radiation detecting devices.
Figure 2:
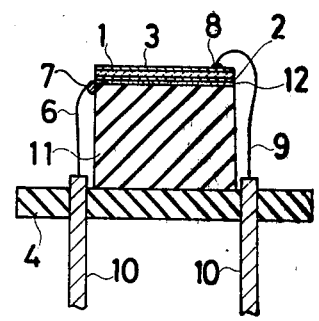

Thus, by utilizing, as the adhesive agent layer 112, a mixture of the heat insulating grains 115 in the electrically conductive adhesive agent 114 at a given ratio, thermal dissipation from the pyroelectric pellet 101 can be considerably decreased and the characteristics which are substantially the same as those of the conventional devices as shown in FIGS. 1 and 2 can be attained. Also the adhesive strength between the pyroelectric pellet 101 and the electrically conductive supporting base 113 is excellent.

More preferably, such heat insulating grains 115 may be coated on the surfaces thereof with an electrically conductive film of such as aluminum, for example, by means of evaporation, for example. By thus forming an electrically conductive film on the surfaces of the heat insulating grains 115, even in the case where the heat insulating grains are superposed in the thickness direction in the adhesive agent layer 112. Thus electrical conduction can be achieved between the electrode 102 and the electrically conductive supporting base 113 through the coating of the heat insulating grains, without the electric conductivity of the adhesive agent layer 112 being adversely affected.

Meanwhile, as the pyroelectric pellet 101, a crystal of lithium tantalate (LiTaO$_3$), a crystal of lithium niobate (LiNbO$_3$), a sinter of a lead zirconate titanate (PZT), a crystal of triglycine (TGS), a crystal of barium strontium niobate (SBN) and the like may be used. Furthermore, as the electrically conductive supporting base 113, copper, copper alloy, iron, iron alloy and the like may be used. Copper alloy may be phosphor bronze or brass, for example, and iron alloy may be stainless. Furthermore, aluminum or aluminum alloy, such as duralumin, may be used for that purpose. It is preferred that the materials of the pyrolelectric pellet 101 and the electrically conductive supporting base 113 be selected to be a combination of those having substantially the same thermal expansion coeffecients. The reason is that such could reduce chance for the occurrence of cracks in the pyroelectric wafer in a lapping process to be described subsequently.

Meanwhile, most preferably, a crystal of lithium tantalate of a Z cut plane (IRE standard ±30 degree) is used as the pyroelectric pellet 101 and copper is used as the electrically conductive supporting base 113.

Meanwhile, the element or chip as shown in FIG. 4 may be configured as a square having sides of 2 mm, as a circle having a diameter of 2 mm, and the like. Typically, the pyroelectric pellet 101 may be approximately 50 μm thick, the adhesive agent layer 112 may be approximately 50 to 100 μm thick, and the electrically conductive supporting base 113 may be approximately 600 μm thick. The electrodes 102 and 103 formed on both surfaces of the pyroelectric pellet 101 may each be an evaporation film of metal, such as nickle chrome, of infrared radiation transparency and the electrodes 102 and 103 may be 150 μm and 50 μm thick, respectively.

Figure 5:
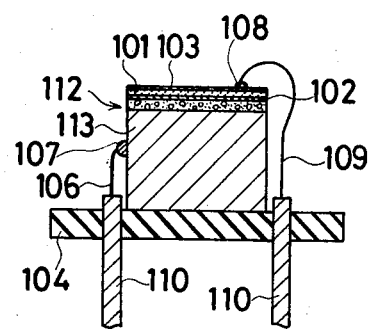
FIGS. 5 and 6 are views showing examples of infrared radiation detecting devices employing the FIG. 4 embodiment.

FIG. 5 is a view showing one example of a structure of a pyroelectric type infrared radiation detecting device in accordance with the FIG. 4 embodiment. Referring to FIG. 5, like portions shown in FIGS. 1 and 2 are denoted by like reference characters and hence a more detailed description thereof will be omitted. In the embodiment shown, an electrically conductive supporting base 113 having a pyroelectric pellet 101 fixed thereon is fixed to an insulating mount base 104. The lead wires 106 and 109 are connected to the terminals 110. The other end of the lead wire 106 is connected to the side surface of the electrically conductive insulating base 113 by means of an electrically conductive adhesive agent 107, for example. Accordingly, connection of the lead wire 106 is very much simplified as compared with the conventional one shown in FIG. 2. As a result, productivity is remarkably enhanced.

Figure 6:
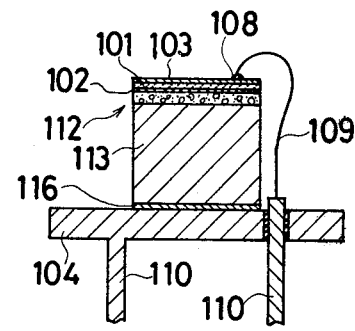

FIG. 6 is a view showing a structure of another embodiment of the present invention. While the FIG. 5 embodiment employs the lead wire 106, the embodiment shown in FIG. 6 employs an electrically conductive adhesive agent 116. The lower surface of the electrically conductive supporting base 113 is electrically connected and mechanically fixed to the mount base 104, which is made of electrically conductive material, by means of the electrically conductive adhesive agent 116. According to the embodiment shown, one lead wire can be dispensed with and hence the productivity and reliability is further enhanced. Meanwhile, it goes without saying that the electrically conductive mount base 104 is electrically connected to one terminal 110.

Figure 7:
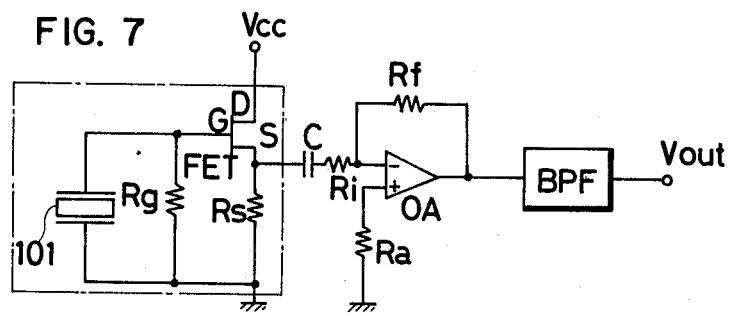
FIG. 7 is a schematic diagram showing a circuit for measuring a characteristic of a pyroelectric type infrared radiation detecting device.

The characteristic of such pyroelectric type infrared radiation detecting device can be measured using a circuit shown in FIG. 7. Referring to FIG. 7, a portion enclosed with two dotted line denotes a pyroelectric type infrared radiation detecting device as incorporated therein. More specifically, although not shown in FIGS. 5 and 6, the mount base 104 is provided thereon with a field effect transistor FET, operational resistors Rg, Rs and the like shown in FIG. 7, which are preferably formed in one chip. The output from the terminal 110 is connected to the (−) input of an operational amplifier OA through a capacitor C and an input resistor Ri. The (+) input of the operational amplifier OA is connected to the ground through the resistor Ra. A feedback resistor Rf is connected between the output and the (−) input of the operational amplifier OA. A bandpass filter BPD is further connected to the output of the operational amplifier OA. The bandpass width of the operational amplifier OA and the bandpass filter BPF is selected to be equal to the chopper frequency of an infrared radiation impinging on the pyroelectric pellet 101. The output of the bandpass filter BPF is withdrawn as an output voltage. Referring to FIG. 7, the field effect transistor FET may be number 2SK44 manufactured by Sanyo Electric Co., Ltd. and the operational amplifier OA may be No. μPC741 manufactured by Fairchild Camera & Instrument Corporation. The resistors Rg, Rs, Ra, Rf and Ri may be $1 \times 10^{10-11} \Omega$, 10 kΩ, 10 kΩ, 1 MΩ and 10 kΩ, respectively, and the capacitor C may be 2 to 3 μF, for example.

Figure 8:
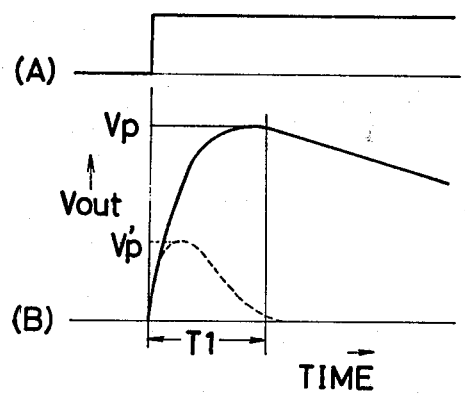
FIG. 8 is a graph showing one example of a voltage wave from exhibiting a response characteristic of an infrared radiation detecting device.

The output voltage obtained at the output terminal Vout of the bandpass filter BPF has a characteristic shown in FIG. 8, for example. More specifically, assuming that an infrared radiation impinging upon the pyroelectric pellet 101 changes as shown in FIG. 8(A), then the output voltage changes as shown in FIG. 8(B). More specifically, when an infrared radiation impinges on the pyroelectric pellet, the output voltage gradually rises and then again gradually falls. Since the thermal time constant is larger than the electrical time constant, the gradient of such rise depend on the thermal time constant of the pyroelectric pellet 100 which is determined by the magnitudes of the thermal capacity and thermal dissipation of the pyroelectric pellet 101. Accordingly, as shown in FIG. 3, in the case where a conventional electrically conductive paste is simply employed as an adhesive agent layer without any expedient, thermal dissipation is large as described previously and the output characteristic exhibits a change as shown by the dotted line in FIG. 8(B). By contrast, in the case where the heat insulating grains 114 are mixed in the adhesive agent layer 112 as shown in FIG. 4, thermal dissipation from the pyroelectric pellet 101 becomes considerably smaller so as to be approximately equal to that of the conventional ones shown in FIGS. 1 and 2. Accordingly, the output voltage approximates an ideal variation as shown by the solid line in FIG. 8(B). As better seen in FIG. 8, there is an extremely remarkable difference between the outputs from the device employing the FIG. 3 element and the device employing the FIG. 4 element.

Thus, in the case where thermal dissipation from the pyroelectric pellet is large, the output voltage more quickly falls and as a result the response frequency is restricted. More specifically, in the case of a variation of the output voltage as shown by the dotted line in FIG. 8(B), the larger the cycle of the infrared radiation as intermittently interrupted by the chopper, and thus the lower the chopper frequency, the lower the output voltage and thus the lower the detection sensitivity as compared with the FIG. 1 element and the inventive element. More specifically, assuming that referring to FIG. 8 the infrared radiation is chopped at the cycle T1 a sufficient output voltage can be withdrawn in the case of the FIG. 4 embodiment, whereas in the case of FIG. 3 the output voltage decreases and a sufficiently large output voltage cannot be obtained. It is apparent that such difference also influences the response frequency.

Figure 9:
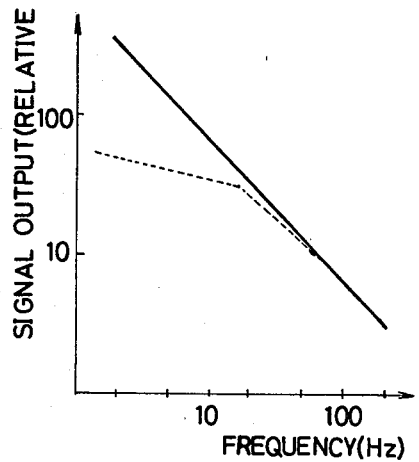
FIG. 9 is a graph showing one characteristic of a pyroelectric type infrared radiation detecting device, wherein the abscissa indicates a chopper frequency and the ordinate indicates a signal output in terms of a relative value.

FIG. 9 is a graph showing a relation between the chopper frequency and the output voltage, wherein the solid line shows a case of the device employing the present invention and the dotted line shows a case of the device employing the FIG. 3 element. As better seen from FIG. 9, according to the present invention a sufficiently large detection sensitivity can be attained even in the case where the frequency of variation of the infrared radiation is very low. However, in the case of the FIG. 3 element, in the frequencies lower than a certain frequency such as 20 Hz, the gradient becomes gentle and hence a sufficient detection sensitivity cannot be attained at such lower frequencies as compared with the FIG. 1 element and the inventive element. On the other hand, such a pyroelectric type infrared radiation detecting device is used not only as a type having a chopper, as in case of a thermometer, but also as an intruder alarm for detecting intrusion upon detection of movement of a human body, and in the latter case the frequency caused by such movement of a human body is extremely low, as low as 0.1 to 10 Hz. Accordingly, the FIG. 3 conventional element cannot perform as an intrusion alarm. By contrast, according to the inventive device, the range of the response frequency is very wide and hence the inventive device has a variety of applications.

Furthermore, one of the items evaluated for a pyroelectric infrared radiation detecting device is its NEP (Noise Equivalent Power) or D* (D star). As far as the NEP is concerned, the smaller the value thereof the better. However, in the case of a device employing the FIG. 3 element, thermal dissipation from the pyroelectric pellet is large and the NEP is degraded and the signal to noise ratio (S/N) is poor. However, according to the present invention, thermal dissipation from the pyroelectric pellet is small and a device of a better value of the NEP is obtained. Furthermore, the D* is referred to as detectivity and is a reciprocal of the NEP. Hence, the larger the D*, the better the device. Accordingly, it should be appreciated that the present inventive device brings about an excellent result as compared with the conventional ones.

Figure 10:
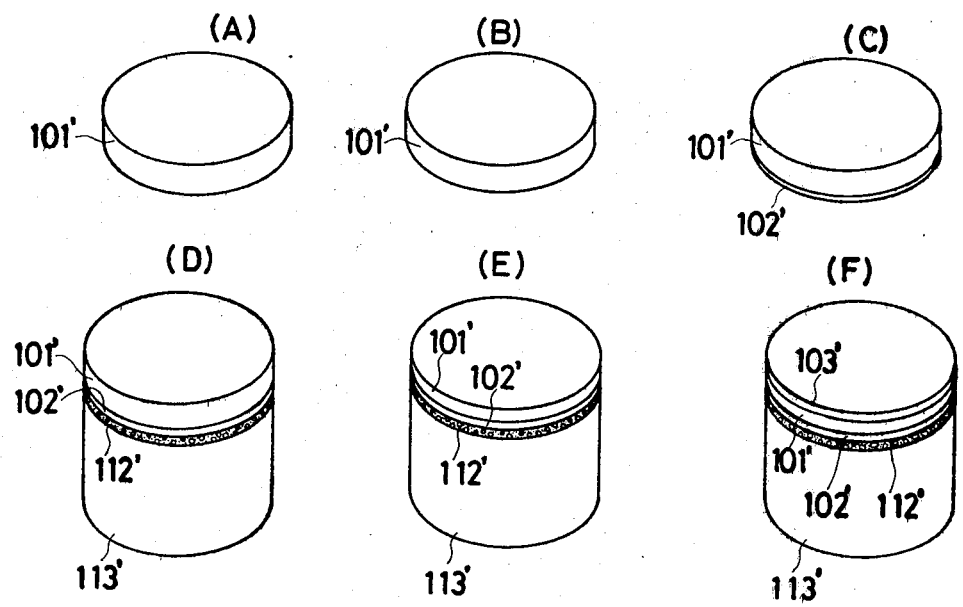
FIG. 10 shows the FIG. 4 element at various stages in accordance with one example of a manufacturing process.

FIG. 10 is a view showing in succession various steps of one example of a manufacturing process of the above described element. Referring to FIG. 10, the manufacturing process will be described. Meanwhile, it is pointed out that FIG. 10 has been drawn merely for the illustrative purpose and hence the dimension in the thickness direction is shown in an exaggeratedly enlarged manner. At the outset, a pyroelectric wafer 101′ of 200 to 500 μm thick made of a crystal of lithuim tantalate formed on the red cut surface is prepared (FIG. 10A). Meanwhile, it goes without saying that the pyroelectric wafer 101′ has been subjected to polarization treatment by some means to exhibit a pyroelectric effect. The lower surface of the wafer 101′ is lapped to be leveled (FIG. 10B). A film of nickel chrome is deposited on the lower surface of the lapped wafer 101+ by evaporation to form an electrode 102′ (FIG. 10C).

Then the wafer shown in FIG. 10C is fixed to an electrically conductive supporting base 113′ prepared in advance, which base is made of copper for example and is approximately 600 μm to 1 mm thick. More specifically, an adhesive agent layer 112′ is formed on the surface of the electrically conductive supporting base 113 by the use of an electrically conductive adhesive agent admixed with heat insulating grains, so that the electrode 102′ on the lower surface of the wafer 101′ is fastened by the adhesive agent layer 112′ to base 113′ and then the adhesive agent layer 112′ is heat set (FIG. 10D).

Then, in such a state as shown in FIG. 10D, the upper surface of the pyroelectric wafer 101′ is lapped to a thickness of 10 to 100 μm (FIG. 10E). Since the thermal expansion coefficients of the pyroelectric wafer 101′ and the electrically conductive supporting base 113′ have been selected to be substantially the same, there is very little liability to cracks in the pyroelectric wafer 101′ in the above described lapping process. On the other hand, in the case of the conventional device shown in FIG. 2, for example, the use of quartz as a material for the supporting base causes a difference between the thermal expansion coefficients of the supporting base and the pyroelectric wafer with a resulting stress during the thermal setting of the adhesive agent layer 112′, which stress causes a distortion in the wafer. It is also very clear that cracks occur when the wafer is lapped, causing a further distortion. However, in the case of the present invention, since there is very little difference between the thermal expansion coefficients of both materials, there is very little liability to cracks in the pyroelectric wafer 101′ in the above described lapping process shown in FIG. 10E. Incidentally, the thermal expansion coefficients of quartz, copper and the Z cut plane of a crystal of lithuim tnantalate are $0.04 \times 10^{-5}$ (cm/°C.), $1.6 \times 10^{-5}$ (cm/°C.) and $1.6 \times 10^{-5}$ (cm/°C.), respectively.

The nickel chrome film of infrared radiation transparency is evaporated on the upper surface of the pyroelectric wafer 101′ that has been lapped as shown in FIG. 10E, thereby forming an electrode 103′ (FIG. 10F). Then in such a state of the composite, which integrally include the wafer 101′, the electrode 102′, the electrode 103′, the adhesive agent layer 112′ and the electrically conductive supporting base 113′, the composite is subjected to a scribing or dicing process, in order to provide an element or chip as shown in FIG. 4. The element or chip thus obtained is used to fabricate an infrared radiation detecting device having a structure as shown in FIGS. 5 and 6, for example.

Meanwhile, in view of the fact that an element or chip is fabricated by dicing the composite as shown in FIG. 10F, it is preferred that the heat insulating grains contained in the adhesive agent layer 112' be substantially uniformly distributed throughout the respective chips. Thus, it would be appreciated that the electrically conductive adhesive agent and the thermal insulating particles must be mixed as much uniformly as possible.

Figure 11:
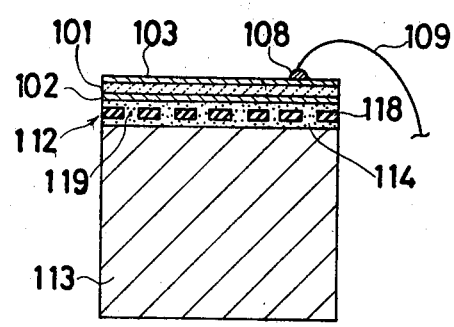
FIG. 11 is a sectional view showing an element or chip in accordance with a further embodiment of the present invention.

FIG. 11 is a sectional view showing an element or chip in accordance with a further embodiment of the present invention. In the case of the FIG. 11 embodiment, a film 118 of having a low thermal conductivity and provided with apertures 119, is embedded in the adhesive agent layer 112. Accordingly, the electrically conductive adhesive agent 114 constituting the adhesive agent layer 112 extends through the apertures 119 to electrically connect and mechanically fix the electrode 102 and the electrically conductive supporting base 113. With such a structure, since the heat insulating sheet 118 has been embedded or interposed, thermal conduction from the pyroelectric pellet 101 to the electrically conductive supporting base 113 is effectively interrupted, thereby decreasing the thermal dissipation from the pyroelectric pellet 101.

Meanwhile, it is essential and sufficient that at least one of the apertures 119 of the film 118 be included in one element. However, it is preferred that the area of the apertures 119 and the area of the film be determined such that an adhesive strength and a thermal conduction interrupting characteristic of substantially the same as those attained in the above described embodiment employing a mixture of heat insulating grains and an electrically conductive adhesive agent, may be attained.

Figure 12:
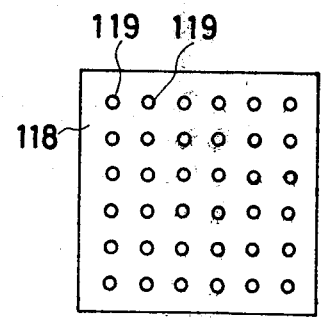
FIG. 12 is a plan view of one example of a sheet or film for use in the FIG. 11 embodiment.

Even in case of fabricating an element or chip of such a structure as shown in FIG. 11, the process previously described in conjunction with FIG. 10 can be employed. However, referring to FIG. 10D, on the occasion of forming an adhesive agent layer 112', a film as shown in FIG. 12 is interposed on the whole surface between the wafer 101' and the electrically conductive supporting base 113'. In this case, it goes without saying that the aperture 119 need be formed such that at least one of the apertures 119 is included in each chip when the same is obtained by the subsequent dicing process shown in FIG. 10F. A pyroelectric type infrared radiation detecting device of such a structure as shown in FIGS. 5 and 6 can be fabricated using an element or chip as shown in FIG. 11. It has been confirmed that even in case where an element or chip as shown in FIG. 11 is employed an excellent characteristic as previously described in conjunction with FIGS. 8 and 9 can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pyroelectric type infrared radiation detecting device, comprising:
 a pyroelectric pellet polarized to generate an electric charge as a function of a variation of an incidental infrared radiation,
 an electrically conductive base supporting said pyroelectric pellet, said electrically conductive base constituting means for withdrawing said electric charge, and
 an adhesive agent layer interposed between said pyroelectric pellet and said electrically conductive base for fastening them together,
 said adhesive agent layer comprising a heat insulating portion for preventing thermal conduction from said pyroelectric pellet to said electrically conductive base and an electrically conductive adhesive agent portion in a mixed manner.

2. A pyroelectric type infrared radiation detecting device in accordance with claim 1, which further comprises an electrode formed on the whole surface of the main surface of said adhesive agent layer of said pyroelectric pellet.

3. A pyroelectric type infrared radiation detecting device in accordance with claims 1 or 2, wherein said pyroelectric pellet is made of a member selected from the group consisting of a crystal of lithium tantalate, a crystal of lithium niobate, sinter of lead zirconate titanate, a crystal of triglycine sulfate, and a crystal of barium strontium niobate.

4. A pyroelectric type infrared radiation detecting device in accordance with claim 1, wherein said electrically conductive base is made of metal.

5. A pyroelectric type infrared radiation detecting device in accordance with claim 4, wherein said metal is any one of copper, copper alloy, iron, iron alloy, aluminum and aluminum alloy.

6. A pyroelectric type infrared radiation detecting device in accordance with claim 1, wherein said pyroelectric pellet is made of a crystal of lithium tantalate.

7. A pyroelectric type infrared radiation detecting device in accordance with claim 6, wherein said pyroelectric pellet is formed of a Z cut plane of a crystal of lithium tantalate.

8. A pyroelectric type infrared radiation detecting device in accordance with claim 6 or 7, wherein said electrically condutive base is made of copper.

9. A pyroelectric type infrared radiation detecting device in accordance with claim 1, wherein said pyroelectric pellet is 10 to 120 $\mu$m thick.

10. A pyroelectric type infrared radiation detecting device in accordance with claim 1, wherein said pyroelectric pellet is 10 to 60 $\mu$m thick.

11. A pyroelectric type infrared radiation detecting device in accordance with claim 1, wherein said adhesive agent layer is formed substantially on the whole surface between said pyroelectric pellet and said electrically conductive base.

12. A pyroelectric type infrared radiation detecting device in accordance with claim 11, wherein said adhesive agent layer comprises a thin sheet of a low thermal conductivity material with a notch portion, said electrically conductive adhesive agent extending through said notch portion to electrically connect said pyroelectric pellet and said electrically conductive base.

13. A pyroelectric type infrared radiation detecting device in accordance with claim 12, wherein said sheet comprises a film of an electrically insulating material.

14. A pyroelectric type infrared radiation detecting device in accordance with claim 11 or 12, wherein said notch portion comprises an aperture.

15. A pyroelectric type infrared radiation detecting device in accordance with claim 1, which further comprises electric charge withdrawing means for withdrawing an electric charge generated in said pyroelectric pellet.

16. A pyroelectric type infrared radiation detecting device in accordance with claim 15, wherein said electric charge withdrawing means comprises an electrode formed on the surface of said pyroelectric pellet fastened to said electrically conductive base.

17. A pyroelectric type infrared radiation detecting device in accordance with claim 16, which further comprises a mount base for supporting a composite including said pyroelectric pellet integrally fastened onto said electrically conductive base by means of said adhesive agent layer, said mount base being formed of an electrically conductive portion on the surface thereof, said electrically conductive base being electrically connected and mechanically fixed to said electrically conductive portion of said mount base.

18. A pyroelectric type infrared radiation detecting device in accordance with claim 16, which further comprises mount base for placing the composite integrally including said pyroelectric pellet and said electrically conductive base fastened to each other, said mount base being made of an electrically conductive material, said electrically conductive base being electrically connected and mechanically fixed to said mount base by means of an electrically conductive adhesive agent.

19. A pyroelectric type infrared radiation detecting device, comprising:
 a pyroelectric pellet polarized to generate an electric charge as a function of a variation of an incidental infrared radiation,
 an electrically conductive base supporting said pyroelectric pellet, said electrically conductive base constituting means for withdrawing said electric charge, and
 an adhesive agent layer interposed between said pyroelectric pellet and said electrically conductive base for fastening them together, said adhesive agent layer being formed substantially on the whole surface between said pyroelectric pellet and said electrically conductive base, said adhesive layer including a heat insulating portion in the form of heat insulating grains for preventing thermal conduction from said pyroelectric pellet to said electrically conductive base, and an electrically conductive adhesive agent portion in which the insulating grains are mixed.

20. A pyroelectric type infrared radiation detecting device in accordance with claim 19 wherein said heat insulating grains are selected to be of a diameter of 10 to 80 μm.

21. A pyroelectric type infrared radiation detecting device in accordance with claim 20, wherein said heat insulating grains are mixed in said electrically conductive adhesive agent at a weight ratio of ½ to 1/100.

22. A pyroelectric type infrared radiation detecting device in accordance with claim 20, wherein said heat insulating grains are mixed in said electrically conductive adhesive agent at a weight ratio of 1/5 to 3/100.

23. A pyroelectric type infrared radiation detecting device in accordance with claim 20, wherein said heat insulating grains are mixed in said electrically conductive adhesive agent at a weight ratio of 1/10 to 1/20.

24. A pyroelectric type infrared radiation detecting device in accordance with claim 20, wherein said heat insulating grains each have electrically-conductive film formed on the surface thereof.

25. A pyroelectric type infrared radiation detecting device in accordance with claim 20, wherein said heat insulating grains are selected to be of a diameter of 10 to 80 μm.

26. A pyroelectric type infrared radiation detecting device in accordance with claim 25, wherein said heat insulating grains are mixed in said electrically conductive adhesive agent at a weight ratio of ½ to 1/100.

27. A pyroelectric type infrared radiation detecting device in accordance with claim 25, wherein said heat insulating grains are mixed in said electrically conductive adhesive agent at a weight ratio of 1/5 to 3/100.

28. A pyroelectric type infrared radiation detecting device in accordance with claim 25, wherein said heat insulating grains are mixed in said electrically conductive adhesive agent at a weight ratio of 1/10 to 1/20.

29. A pyroelectric type infrared radiation detecting device in accordance with any one of claims 25 to 28 or 20 to 23, wherein said heat insulating grains are glass balls.

30. A pyroelectric type infrared radiation detecting device in accordance with claim 29, wherein said glass balls are hollow.

31. A pyroelectric type infrared radiation detecting device in accordance with claim 29, wherein said glass balls are solid.

32. A pyroelectric type infrared radiation detecting device in accordance with any one of claims 25 to 28 or 20 to 23, wherein said heat insulating grains are ceramic grains.

33. A pyroelectric type infrared radiation detecting device in accordance with claim 20, wherein said heat insulating grains are made of a member selected from the group consisting of zirconia, alumina and magnesia.

34. A pyroelectric type infrared radiation detecting device in accordance with any one of claims 20, which further comprises electric charge withdrawing means for withdrawing an electric charge generated in said pyroelectric pellet.

35. A pyroelectric type infrared radiation detecting device in accordance with claim 34, wherein said electric charge withdrawing means comprises an electrode formed on the surface of said pyroelectric pellet fastened to said electrically conductive base.

36. A pyroelectric type infrared radiation detecting device in accordance with claim 35, which further comprises a mount base for supporting a composite including said pyroelectric pellet integrally fastened onto said electrically conductive base by means of said adhesive agent layer, said mount base being formed of an electrically conductive portion on the surface thereof, said electrically conductive base being electrically connected and mechanically fixed to said electrically conductive portion of said mount base.

37. A pyroelectric type infrared radiation detecting device in accordance with claim 35, which further comprises a mount base for placing a composite integrally including said pyroelectric pellet and said electrically conductive base fastened to each other, said mount base being made of an electrically conductive material, said electrically conductive base being electrically connected and mechanically fixed to said mount base by means of an electrically conductive adhesive agent.

38. A pyroelectric type infrared radiation detecting device in accordance with any one of 1 or 20, wherein the thermal expansion coefficients of said pyroelectric pellet and said electrically conductive base are selected to be substantially the same.

39. A method for manufacturing a pyroelectric type infrared radiation detecting device, comprising the steps of preparing a polarized pyroelectric wafer, p1 preparing an electrically conductive supporting base for supporting said pyroelectric wafer, fastening said pyroelectric wafer onto said electrically conductive base by means of an adhesive agent layer including a mixture of a heat insulating portion for preventing thermal conduction from said pyroelectric wafer to said electrically conductive base and an electrically conductive adhesive agent portion, thereby to provide a composite, and dicing said composite, including said wafer integrally fastened to said electrically conductive base by means of said adhesive agent layer, thereby to provide said chip.

40. A manufacturing method in accordance with claim 39, wherein said pyroelectric wafer is made of a member selected from the group consisting of a crystal of lithium tantalate, a crystal of lithuim niobate, sinter of lead zirconate tatanate, a crystal of trigrycine sulfate, and a crystal of barrium niobate.

41. A manufacturing method in accordance with claim 39 or 40, which comprises the step of lapping, prior to said dicing step, said pyroelectric wafer as fixed to said electrically conductive base for making thin said pyroelectric wafer.

42. A manufacturing method in accordance with claim 41, wherein said pyroelectric wafer as prepared and as fixed to said electrically conductive base is thicker than 100 μm, and said pyroelectric wafer is made thinner than 100 μm by said lapping step.

43. A manufacturing method in accordance with any one of claim 39, wherein said electrically conductive base is made of copper, copper alloy, iron, iron alloy, aluminum or aluminum alloy.

44. A manufacturing method in accordance with any one of claim 39, wherein said adhesive agent layer comprises a sheet of a low thermal conductivity material having a notch portion, serving as said heat insulating portion, and an electrically conductive adhesive agent, said fastening step comprises the steps of preparing said sheet of a low thermal conductivity material, preparing said electrically conductive adhesive agent, placing said sheet having a low thermal conductivity on the surface of said electrically conductive base, and electrically connecting and mechanically fixing said pyroelectric wafer onto said electrically conductive base by the use of said electrically conductive adhesive agent so that it extends through said notch portion of said sheet.

45. A manufacturing method in accordance with claim 44, wherein said sheet of a low thermal conductivity is a film of insulative material.

46. A manufacturing method in accordance with claim 39, wherein said adhesive agent layer comprises an electrically conductive adhesive agent and heat insulating grains mixed in said electrically conductive adhesive agent, and said fastening steps comprises the step of preparing said heat insulating grains, preparing said electrically conductive adhesive agent, mixing said heat insulating grains in said electrically conductive adhesive agent, forming a layer of said electrically conductive adhesive agent admixed with said heat insulating grains on the surface of said electrically conductive base, and fastening said pyroelectric wafer onto said electrically conductive base by means of said adhesive agent layer formed thereon.

47. A manufacturing method in accordance with claim 46, wherein said heat insulating grains are glass balls.

48. A manufacturing method in accordance with claim 47, wherein said glass balls are hollow.

49. A manufacturing method in accordance with claim 47, wherein said glass balls are solid.

50. A manufacturing method in accordance with claim 46, wherein said heat insulating grains are ceramic grains.

51. A manufacturing method in accordance with claim 50, wherein said ceramic grains are made of a member selected from the group consisting of zirconia, alumina and magnetia.

52. A manufacturing method in accordance with claim 46, wherein said step of preparing said heat insulating grains comprises the step of forming an electrically conductive film on the surface of each of said prepared grains.

53. A pyroelectric type infrared radiation detecting device, comprising a chip produced by preparing a pyroelectric wafer and an electrically conductive base, fixing said pyroelectric wafer onto said electrically conductive base by means of an adhesive agent layer including a mixture of a heat insulating portion for preventing thermal conduction from said pyroelectric wafer to said electrically conductive base and an electrically conductive adhesive agent portion, thereby to provide a composite, and dicing the composite thus obtained.

54. A pyroelectric type infrared radiation detecting device in accordance with claim 53, wherein said adhesive agent layer comprises a thin sheet of a low thermal conductivity material and having a notch portion, said electrically conductive adhesive agent extending through said notch portion to electrically connect said pyroelectric pellet and said electrically conductive base.

55. A pyroelectric type infrared radiation detecting device in accordance with claim 54, wherein said sheet comprises a film of an electrically insulating material.

56. A pyroelectric type infrared radiation detecting device in accordance with claim 53, wherein said adhesive agent layer comprises a mixture of said electrically conductive adhesive agent and heat insulating grains.

57. A pyroelectric type infrared radiation detecting device in accordance with claim 56, wherein said heat insulating grains are glass balls.

58. A pyroelectric type infrared radiation detecting device in accordance with claim 57, wherein said glass balls are hollow.

59. A pyroelectric type infrared radiation detecting device in accordance with claim 56, wherein said heat insulating grains are ceramic grains.

60. A pyroelectric type infrared radiation detecting device in accordance with claim 59, wherein said heat insulating grains are made of a member selected from the group consisting of zirconia, alumina and magnesia.

* * * * *

UNITED STATES PATENT AND TRADEMARK OFFICE
CERTIFICATE OF CORRECTION

PATENT NO. : 4,367,408

DATED : January 4, 1983

INVENTOR(S) : Terutoyo Imai and Shoichi Nakano

It is certified that error appears in the above-identified patent and that said Letters Patent are hereby corrected as shown below:

On the cover page of the patent under "Foreign Application Priority Data" the second priority item should read
--December 25, 1979 [JP] Japan 54/169674--

In claim 39 (col. 13, ln. 1) delete "pl" and "preparing an electrically conductive supporting base for supporting said pyroelectric wafer," should be a new paragraph.

Signed and Sealed this

Third Day of May 1983

[SEAL]

Attest:

Attesting Officer

GERALD J. MOSSINGHOFF

Commissioner of Patents and Trademarks